(12) United States Patent
Yoon et al.

(10) Patent No.: US 9,241,399 B2
(45) Date of Patent: Jan. 19, 2016

(54) PRINTED CIRCUIT BOARD AND LIGHT EMITTING DEVICE

(71) Applicant: LG INNOTEK CO., LTD., Seoul (KR)

(72) Inventors: Sang In Yoon, Seoul (KR); Jeong Han Kim, Seoul (KR); Jeung Ook Park, Seoul (KR); Hyun Gu Im, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/580,491

(22) Filed: Dec. 23, 2014

(65) Prior Publication Data

US 2015/0181691 A1 Jun. 25, 2015

(30) Foreign Application Priority Data

Dec. 24, 2013 (KR) .................. 10-2013-0162198

(51) Int. Cl.
| | |
|---|---|
| *H05K 1/02* | (2006.01) |
| *H01L 33/62* | (2010.01) |
| *H05K 1/09* | (2006.01) |
| *H05K 1/05* | (2006.01) |
| *H05K 3/24* | (2006.01) |

(52) U.S. Cl.
CPC .............. *H05K 1/0201* (2013.01); *H01L 33/62* (2013.01); *H05K 1/05* (2013.01); *H05K 1/09* (2013.01); *H01L 2224/48091* (2013.01); *H01L 2224/48227* (2013.01); *H01L 2224/73265* (2013.01); *H01L 2224/8592* (2013.01); *H05K 1/053* (2013.01); *H05K 1/056* (2013.01); *H05K 3/243* (2013.01); *H05K 2201/0338* (2013.01); *H05K 2201/10106* (2013.01)

(58) Field of Classification Search
CPC ......... H01L 33/62; H05K 1/09; H05K 1/0201
USPC ...................................... 257/99, 756
See application file for complete search history.

(56) References Cited

U.S. PATENT DOCUMENTS

| | | | | |
|---|---|---|---|---|
| 5,102,829 | A | * | 4/1992 | Cohn .......................... 29/837 |
| 2007/0090522 | A1 | * | 4/2007 | Alhayek et al. ............. 257/723 |
| 2011/0101394 | A1 | * | 5/2011 | McKenzie et al. .......... 257/98 |
| 2012/0103588 | A1 | | 5/2012 | Kim et al. |

FOREIGN PATENT DOCUMENTS

| | | |
|---|---|---|
| KR | 10-2009-0111071 A | 10/2009 |
| KR | 10-2011-0030257 A | 3/2011 |
| KR | 10-1237685 B1 | 2/2013 |
| WO | WO 2010/050896 A1 | 5/2010 |
| WO | WO 2010/143829 A2 | 12/2010 |

OTHER PUBLICATIONS

European Search Report dated Jun. 1, 2015 issued in Application No. 14199842.7.

* cited by examiner

*Primary Examiner* — Tuan Nguyen
(74) *Attorney, Agent, or Firm* — Ked & Associates, LLP

(57) ABSTRACT

A printed circuit board according to an embodiment of the present invention includes a substrate including a first metal layer, a second metal layer formed on one surface of the first metal layer, and a third metal layer formed on the other surface of the first metal layer, an insulating layer formed on the second metal layer, and a circuit pattern formed on the insulating layer. A cavity configured to accommodate a light emitting element package is formed in the insulating layer. A thermal conductivity of the first metal layer is greater than thermal conductivities of the second metal layer and the third metal layer.

14 Claims, 2 Drawing Sheets

PRINTED CIRCUIT BOARD AND LIGHT EMITTING DEVICE

CROSS-REFERENCE TO RELATED APPLICATION

This application claims priority under 35 U.S.C. §119 to Korean Patent Application No. 10-2013-0162198, filed on Dec. 24, 2013, whose entire disclosure is hereby incorporated by reference.

BACKGROUND

1. Field

The present invention relates to a printed circuit board and a light emitting device including the same.

2. Background

Light emitting elements are devices for converting electricity to light. As representative light emitting elements, there are light-emitting diodes (LEDs), semiconductor laser diodes (LD), etc.

LEDs are devices in which electrons and holes meet at P-N junction areas to emit light when currents are applied thereto. Usually, LEDs are fabricated in a package structure in which they are installed. An LED package is mounted on a printed circuit board (PCB) and configured to emit light by receiving currents from an electrode formed on the PCB.

In an LED package, heat generated in an LED may directly affect light-emitting performance or a lifespan of the LED package. When the heat generated in the LED stays therein for a long time, dislocation and mismatch may be generated in a crystal structure of the LED, which may shorten the lifespan of the LED.

Accordingly, techniques for promoting the dissipation of heat generated from an LED have been proposed. For example, a metal PCB having excellent heat dissipating characteristics may be applied to an LED package.

Meanwhile, when an LED package is mounted on a metal PCB, an expensive plating process may be performed to prevent oxidation, thus increasing the cost of the PCB.

BRIEF DESCRIPTION OF THE DRAWINGS

The embodiments will be described in detail with reference to the following drawings in which like reference numerals refer to like elements wherein.

DETAILED DESCRIPTION

Figure 1:
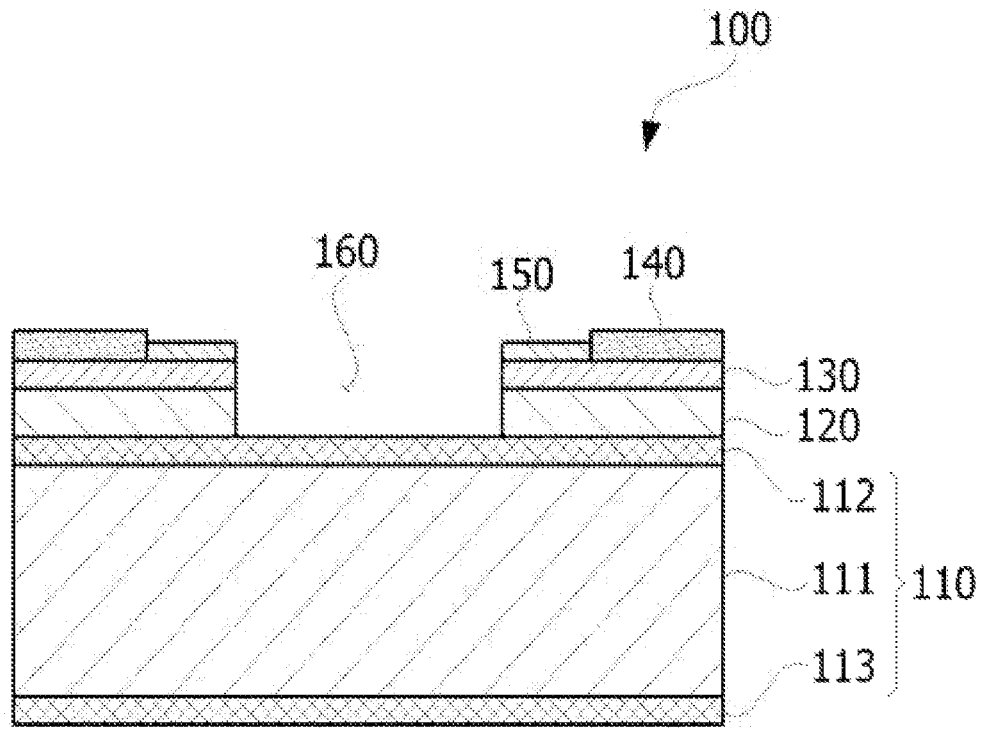
FIG. 1 is a cross-sectional view illustrating a printed circuit board (PCB) according to an embodiment of the present invention.

Exemplary embodiments of the present invention will be described in detail below with reference to the accompanying drawings. However, exemplary embodiments of the present invention may be embodied in many alternate forms and should not be construed as limited to the exemplary embodiments of the present invention set forth herein.

It will be understood that, although the terms first, second, etc. may be used herein to describe various elements, components and/or sections, these elements, components and/or sections should not be limited by these terms. These terms are only used to distinguish one element, component, or section from another. Therefore, a first element, a first component, or a first section could be termed a second element, a second component, or a second section within the scope of the invention. As used herein, the term "and/or" includes each and all combinations of at least one of the referred items.

The terminology used herein is for the purpose of describing particular embodiments only and is not intended to be limiting of the invention. As used herein, the singular forms "a," "an," and "the" are intended to include the plural forms as well, unless the context clearly indicates otherwise.

It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the present disclosure, when it is expressed that any layer (film), region, pattern, or structure is formed "at the upper portion of (on)" or "at the lower portion of (under)" any layer (film), region, or pattern, the expressions "the upper portion (on)" and "the lower portion (under)" include both "directly" and "indirectly." In addition, the criterion of "upper (on)" or "lower (under)" of each layer will be described based on the drawings.

In the drawings, the thickness and size of each layer shown in the drawings may be exaggerated, omitted, or schematically drawn for the purpose of convenience or clarity. In addition, the size of each component does not reflect an actual size.

Hereinafter, the embodiment of the present invention will be described in detail with reference to accompanying drawings. The same reference numerals denote the same components throughout the specification, and repeated descriptions thereof will be omitted.

Figure 2:
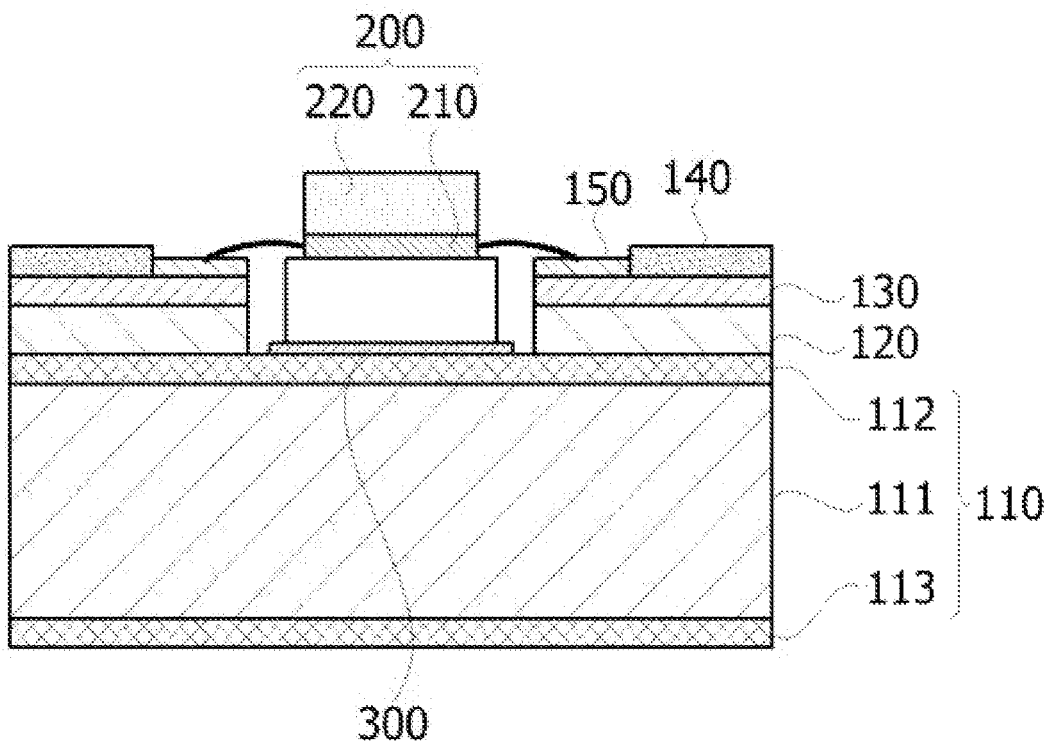
FIG. 2 is a cross-sectional view illustrating a light emitting device including a PCB according to an embodiment of the present invention.
Figure 3:
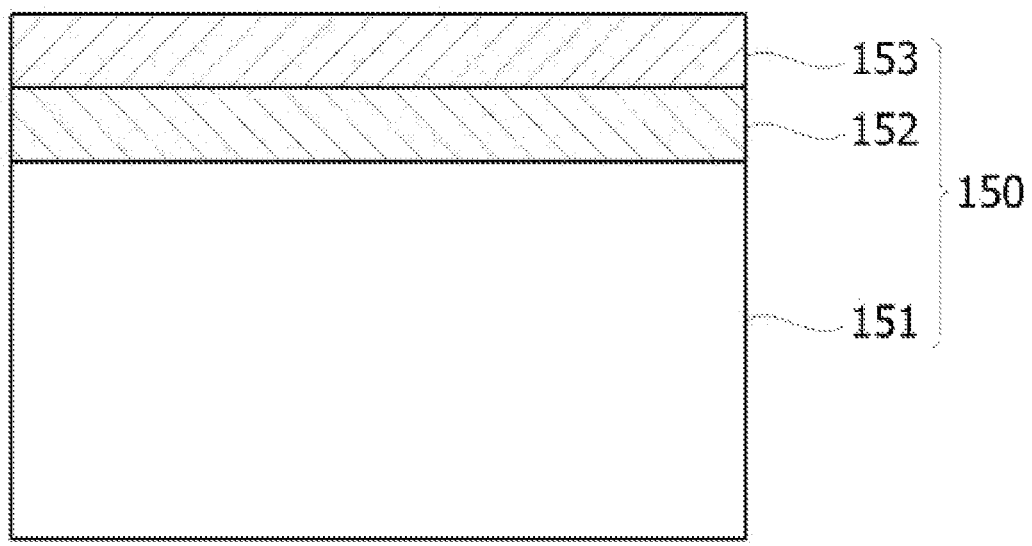
FIG. 3 illustrates an example of a plating layer for wire-bonding according to an embodiment of the present invention.

FIG. 1 is a cross-sectional view illustrating a printed circuit board (PCB) according to an embodiment of the present invention, and FIG. 2 is a cross-sectional view illustrating a light emitting device including a PCB according to an embodiment of the present invention. In addition, FIG. 3 illustrates an example of an electroplating layer for wire-bonding according to an embodiment of the present invention.

Referring to FIGS. 1 and 2, a PCB 100 according to the embodiment of the present invention may include a substrate 110, an insulating layer 120, a circuit pattern 130, a protection layer 140, and a plating layer 150.

The substrate 110 may include a first metal layer 111 having high thermal conductivity. The substrate 110 may further include second and third metal layers 112 and 113 disposed on both sides of the first metal layer 111.

The first metal layer 111 may include, for example, copper (Cu) or a Cu alloy having high thermal conductivity. The first metal layer 111 may have low thermal resistance, and thus perform a heat-dissipating function to dissipate heat generated from a light emitting element package 200 to the outside.

The thickness of the first metal layer 111 may be designed to be different according to characteristics of a product to which the PCB 100 is applied.

The thickness of the first metal layer 111 may be, but is not limited to, 50 to 95% of a total thickness of the substrate 110.

For example, when the total thickness of the substrate 110 is 1 mm, the thickness of the first metal layer 111 may be 500 to 950 μm.

The second and third metal layers 112 and 113 may be different kinds of metal layers from the first metal layer 111. For example, the second and third metal layers 112 and 113 may include aluminum (Al) or an Al alloy.

The second metal layer 112 may be formed on the first metal layer 111 and disposed between the first metal layer 111 and the insulating layer 120.

The second metal layer 112 may improve adhesion between the first metal layer 111 and the insulating layer 120. In addition, the second metal layer 112 may function to prevent surface oxidation of the substrate 110 exposed by a cavity 160.

The third metal layer 113 may be formed on a rear surface of the first metal layer 111.

The third metal layer 113 may function to prevent surface oxidation of the substrate 110.

Al has a thermal conductivity of more than 180 W/m·k and has high temperature thermal resistance at high temperature.

Al has a relatively lighter weight but a relatively higher thermal resistance than Cu. Accordingly, as a ratio of thickness of the second and third metal layers 112 and 113 in the substrate 110 decreases, the thermal resistance of the substrate 110 may decrease. On the other hand, as a ratio of thickness of the second and third metal layers 112 and 113 in the substrate 110 increases, the substrate 110 may be fabricated to have a lighter weight, and the price of the substrate may be lowered.

The thicknesses of the second metal layer 112 and third metal layer 113 may be designed differently according to characteristics of a product to which the PCB 100 is applied.

The ratio of the thickness of the second and third metal layers 112 and 113, that is, the sum of the thickness of the second metal layer 112 and the thickness of the third metal layer 113 in the substrate 110 may be, but is not limited to, 5 to 50% of the total thickness of the substrate 110. In addition, the thickness of each of the second and third metal layers 112 and 113 may be 2.5 to 25% of the total thickness of the substrate 110.

For example, when total thickness of the substrate 110 is 1 mm, the sum of the thickness of the second metal layer 112 and the thickness of the third metal layer 113 in the substrate 110 may be 50 to 500 μm. In addition, the thickness of each of the second and third metal layers 112 and 113 may be 25 to 250 μm.

When the ratio of the thickness of the second and third metal layers 112 and 113 in the substrate 110 is less than 5%, a manufacturing process may become difficult and surface oxidation of the substrate 110 may not be prevented. In addition, when the ratio of the thickness of the second and third metal layers 112 and 113 in the substrate 110 is more than 50%, a heat dissipating ability may be lowered and a light emitting device generating a large amount of heat, such as a light-emitting diode, may be difficult to mount on the PCB 100.

The second metal layer 112 and the third metal layer 113 may have the same thickness. Alternatively, the second metal layer 112 and the third metal layer 113 may have different thicknesses.

The substrate 110 may be formed in a clad substrate so as to improve endurance. The clad substrate may be formed by stacking the first, second and third metal layers 111, 112 and 113, and then combining them using a hot- or cold-rolling method.

The insulating layer 120 may be disposed on the second metal layer 112.

The insulating layer 120 may function to prevent the substrate 110 from being electrically connected to the circuit pattern 130.

The insulating layer 120 may be selected from the group consisting of an epoxy resin, a polyester resin, and a polyimide resin.

The insulating layer 120 may be combined with second metal layer 112 in various methods.

The insulating layer 120 may be combined with the second metal layer 112 using a sputtering method.

The insulating layer 120 may be stacked on the second metal layer 112 in a provisionally cured state and then fully cured by compression to be combined with the second metal layer 112.

The insulating layer 120 may be coated on the second metal layer 112 and then cured to be combined with the second metal layer 112.

The cavity 160 configured to accommodate the light emitting element package 200 may be formed through the insulating layer 120.

The cavity 160 may be formed through the insulating layer 120 in the shape of an opening having an open top. Accordingly, a portion of the second metal layer 112 may form a lower surface of the cavity 160 and be exposed through the opening of the cavity 160.

Accordingly, the second metal layer 112 may function to prevent surface oxidation of the substrate 110 exposed through the cavity 160.

By forming the cavity 160, the insulating layer 120 disposed between the light emitting element package 200 and the substrate 110 may be removed, and thus a thermal resistance factor by the insulating layer 120 may be removed. That is, since heat generated by the light emitting element package 200 is directly transmitted to the substrate 110 by forming the cavity 160, a heat dissipating ability of the PCB 100 may be improved.

The cavity 160 may be formed by a cutting process using a laser apparatus, a computerized numerical control (CNC) milling process, or a punching process.

The circuit pattern 130 may be disposed on the insulating layer 120.

The circuit pattern 130 may be formed of a conductive metal. For example, the circuit pattern 130 may be formed of Cu or a Cu alloy mainly composed of Cu.

The protection layer 140 and the plating layer 150 may be disposed on the circuit pattern 130.

The protection layer 140 may function to electrically isolate the PCB 100 and reduce electrical/physical stress.

The protection layer 140 may be formed using a solder resist, a coverlay, or the like.

The plating layer 150 may be electrically connected to the circuit pattern 130, and form a bonding pad configured for wire-bonding of the light emitting element package 200.

The plating layer 150 may be formed by an electroless Cu plating method, a chemical Cu plating method, an electroless nickel immersion gold (ENIG) method, an electroless nickel electroless palladium immersion gold (ENEPIG) method, an electroless nickel auto-catalytic gold (ENAG) method, an electroless nickel electroless Au & Ag immersion gold (ENA2) method, a direct immersion gold (DIG) method, or an electroless silver plating method.

For example, the plating layer 150 may be formed by the ENEPIG method as illustrated in FIG. 3. Referring to FIG. 3, the ENEPIG method is an electroless plating method by which a three-layered structure of electroless Ni, electroless Pd, and substituted Au is formed. The plating layer 150 formed by the ENEPIG method may be formed by sequentially stacking a nickel (Ni) layer 151, a palladium (Pd) layer 152, and a gold layer 153. Since the plating layer 150 formed by the ENEPIG method includes the palladium layer 152 between the Ni layer 151 and the gold layer 153, thermal diffusion of the Ni layer 151 may be suppressed, and thus a bond strength of soldering may be improved.

Referring again to FIG. 2, the light emitting device may include the PCB 100 and the light emitting element package 200 disposed on the PCB 100.

The light emitting element package 200 may include a ceramic substrate 210 and a light emitting device chip 220 disposed on the ceramic substrate 210.

The light emitting element package 200 may be accommodated in the cavity (reference numeral 160 in FIG. 1) of the insulating layer 120. In addition, the light emitting element package 200 may be attached to the second metal layer 112 of the substrate 110 exposed through the cavity 160 using a conductive adhesive 300 as a medium.

The conductive adhesive 300 may be an electrically conductive adhesive and include a metal paste, etc.

Wires electrically respectively connected to an anode terminal and a cathode terminal of the light emitting element package 200 may be electrically connected to the circuit pattern 130 through the plating layer 150.

Generally, while manufacturing a PCB, a circuit pattern and a plating layer may be formed after a substrate and an insulating layer are stacked and combined. Accordingly, it is difficult to form a wire-bonding plating layer and an anti-oxidation layer in separate plating processes. This is because a masking process is required to form the plating layer for wire bonding and the anti-oxidation layer in separate plating processes, which may act as a factor increasing a failure rate.

According to the embodiment of the present invention, by applying a clad substrate in which an Al metal layer is combined to both sides of a first metal layer of a PCB, an anti-oxidation layer need not be separately formed. In addition, since a plating layer is not formed on a surface of the Al metal layer due to the nature of Al even when a surface thereof is exposed to a plating process environment, a separate masking process need not be performed.

As described above, according to the embodiment of the present invention, since the plating layer formed on a surface of the substrate in order to prevent oxidation is replaced by the Al metal layer, a high-end plating area portion may be minimized and thus material costs required in a plating process may be minimized. In addition, since the masking process for forming the wire-bonding plating layer and the anti-oxidation layer in separate processes is omitted, price competitiveness of a PCB may be improved.

Meanwhile, according to the embodiment of the present invention, the substrate is formed as a clad substrate in which Al metal layers are stacked and combined on both sides of a Cu metal layer, but the inventive concept is not limited thereto.

According to the embodiment of the present invention, the Cu metal layer may be replaced by another metal layer having excellent thermal conductivity.

According to the embodiment of the present invention, since an expensive plating process is omitted, a unit cost of the printed circuit may be reduced.

In addition, the metal layers combined on both sides of the Cu metal layer may be replaced by a different kind of metal layer from Al. In this case, the metal layers combined on both sides of the Cu metal layer may be a nonferrous metal, which is different kind of metal from Cu, has high-temperature thermal resistance such that a thermal conductivity thereof is 180 W/m·k or more, and does not form a plating layer on a surface thereof even when exposed to the plating process environment. For example, a Ni or Ni alloy metal layer, a molybdenum (Mo) or Mo alloy metal layer, a stainless steel metal layer, or the like may replace the Al metal layer to be stacked on the Cu metal layer.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

The present invention is directed to a printed circuit board and a light emitting device including the same.

According to an aspect of the present invention, there is provided a printed circuit board including a substrate including a first metal layer, an insulating layer formed on the substrate and including a cavity configured to accommodate a light emitting element package, a circuit pattern formed on the insulating layer, and a plating layer formed on the circuit pattern. The plating layer is not formed on the substrate.

According to another aspect of the present invention, there is provided a printed circuit board including a substrate including a first metal layer, a second metal layer formed on one surface of the first metal layer, and a third metal layer formed on the other surface of the first metal layer, an insulating layer formed on the second metal layer, and a circuit pattern formed on the insulating layer. A cavity configured to accommodate a light emitting element package is formed in the insulating layer. A thermal conductivity of the first metal layer is greater than thermal conductivities of the second metal layer and the third metal layer.

According to still another aspect of the present invention, there is provided a light emitting device including a substrate including a first metal layer, a second metal layer formed on one surface of the first metal layer, and a third metal layer formed on the other surface of the first metal layer, an insulating layer formed on the second metal layer and including a cavity, a circuit pattern formed on the insulating layer, and a light emitting element package accommodated in the cavity and bonded onto the substrate. A thermal conductivity of the first metal layer is greater than thermal conductivities of the second metal layer and the third metal layer.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A printed circuit board, comprising: a substrate including a first metal layer and a second metal layer formed on a first surface of the first metal layer;
   an insulating layer formed on the second metal layer and including a cavity configured to accommodate a light emitting element package;
   a circuit pattern formed on the insulating layer; and
   a plating layer formed on the circuit pattern,
   wherein the plating layer is not formed on a portion of the substrate where the insulating layer does not cover,
   wherein the second metal layer is a different type of metal layer from the first metal layer,
   wherein the second metal layer is exposed by the cavity,
   wherein the substrate further includes a third metal layer formed on a second surface of the first metal layer, and which is a different type of metal layer from the first metal layer, and
   wherein the second metal layer and the third metal layer prevent surface oxidation of the first metal layer.

2. The printed circuit board of claim 1, wherein the first metal layer includes copper (Cu).

3. The printed circuit board of claim 1, wherein the second metal layer and the third metal layer include at least one of aluminum (Al), nickel (Ni), molybdenum (Mo), or stainless steel.

4. The printed circuit board of claim 1, wherein the thickness of the second and third metal layers is 5 to 50% of an entire thickness of the substrate.

5. The printed circuit board of claim 1, wherein the thickness of each of the second metal layer and the third metal layer is 2.5 to 25% of an entire thickness of the substrate.

6. The printed circuit board of claim 1, wherein the plating layer includes a Ni layer, a palladium (Pd) layer provided on the Ni layer, and a gold (Au) layer provided on the Pd layer.

7. A printed circuit board, comprising:
   a substrate including a first metal layer, a second metal layer formed on a first surface of the first metal layer, and a third metal layer formed on a second surface of the first metal layer;
   an insulating layer formed on the second metal layer; and
   a circuit pattern formed on the insulating layer,
   wherein a cavity configured to accommodate a light emitting element package is formed in the insulating layer,
   wherein a thermal conductivity of the first metal layer is greater than thermal conductivities of the second metal layer and the third metal layer,
   wherein the second metal layer is exposed by the cavity, and
   wherein the second metal layer and the third metal layer prevent surface oxidation of the first metal layer.

8. The printed circuit board of claim 7, wherein the first metal layer includes Cu.

9. The printed circuit board of claim 8, wherein the second metal layer and the third metal layer include at least one of Al, Ni, Mo, or stainless steel.

10. The printed circuit board of claim 7, wherein the thickness of the second and third metal layers is 5 to 50% of an entire thickness of the substrate.

11. The printed circuit board of claim 7, wherein the thickness of each of the second metal layer and the third metal layer is 2.5 to 25% of an entire thickness of the substrate.

12. The printed circuit board of claim 7, further comprising a plating layer formed on the circuit pattern and configured for wire-bonding of the light emitting element package.

13. A light emitting device, comprising:
    a substrate including a first metal layer, a second metal layer formed on a first surface of the first metal layer, and a third metal layer formed on a second surface of the first metal layer;
    an insulating layer formed on the second metal layer and including a cavity;
    a circuit pattern formed on the insulating layer; and
    a light emitting element package accommodated in the cavity and bonded onto the substrate,
    wherein a thermal conductivity of the first metal layer is greater than thermal conductivities of the second metal layer and the third metal layer, and
    wherein the second metal layer is exposed by the cavity.

14. The light emitting device of claim 13, wherein the light emitting element package is bonded onto the substrate by a conductive adhesive.

* * * * *